United States Patent
Takayama et al.

(12) 
(10) Patent No.: US 10,784,040 B2
(45) Date of Patent: Sep. 22, 2020

(54) NOISE FILTER IMPLEMENTATION STRUCTURE

(71) Applicant: MURATA MANUFACTURING CO., LTD., Kyoto-fu (JP)

(72) Inventors: Kota Takayama, Nagaokakyo (JP); Yoshihiro Imanishi, Nagaokakyo (JP); Shingo Uda, Nagaokakyo (JP)

(73) Assignee: Murata Manufacturing Co., Ltd., Kyoto-fu (JP)

( * ) Notice: Subject to any disclaimer, the term of this patent is extended or adjusted under 35 U.S.C. 154(b) by 492 days.

(21) Appl. No.: 15/213,857

(22) Filed: Jul. 19, 2016

(65) Prior Publication Data
US 2017/0026018 A1 Jan. 26, 2017

(30) Foreign Application Priority Data
Jul. 22, 2015 (JP) .................................. 2015-144968

(51) Int. Cl.
*H03H 7/42* (2006.01)
*H01F 27/40* (2006.01)
(Continued)

(52) U.S. Cl.
CPC ........... *H01F 27/402* (2013.01); *H03H 7/427* (2013.01); *H01F 27/29* (2013.01); *H01F 2017/0093* (2013.01)

(58) Field of Classification Search
CPC ..................................................... H03H 7/427
See application file for complete search history.

(56) References Cited

U.S. PATENT DOCUMENTS 6,472,969 B1 * 10/2002 Hanato ................. H01F 17/045
336/192
7,085,118 B2 8/2006 Inoue et al.
(Continued)

FOREIGN PATENT DOCUMENTS

JP 2000-340437 A 12/2000
JP 2000340437 A * 12/2000 ............. H01F 17/04
(Continued)

OTHER PUBLICATIONS

The First Office Action issued by the State Intellectual Property Office of the People's Republic of China dated Jul. 31, 2017, which corresponds to Chinese Patent Application No. 201610554822.3 and is related to U.S. Appl. No. 15/213,857; with English language translation.

(Continued)

*Primary Examiner* — Elvin G Enad
*Assistant Examiner* — Malcolm Barnes
(74) *Attorney, Agent, or Firm* — Studebaker & Brackett PC

(57) ABSTRACT

A transmission line includes three wires formed on a substrate. Each of the transmission lines transmits a three-level signal. A common-mode choke coil is inserted into the transmission line. The common-mode choke coil includes three coils coupled to one another and three pairs of outer electrodes, each of the three pairs being connected to the corresponding two ends of the coils. The outer electrodes of the common-mode choke coil are connected to the transmission line such that the three coils are serially inserted into the respective three wires.

5 Claims, 6 Drawing Sheets

(51) Int. Cl.
*H01F 27/29* (2006.01)
*H01F 17/00* (2006.01)

(56) References Cited

U.S. PATENT DOCUMENTS

| | | | | |
|---|---|---|---|---|
| 2004/0233606 | A1* | 11/2004 | Inoue | H01C 1/16 |
| | | | | 361/118 |
| 2005/0052267 | A1* | 3/2005 | Singu | H01F 17/045 |
| | | | | 336/83 |
| 2006/0125570 | A1* | 6/2006 | Hamada | H04B 3/30 |
| | | | | 333/12 |
| 2010/0182724 | A1* | 7/2010 | Ito | H03H 7/0107 |
| | | | | 361/56 |
| 2011/0279935 | A1* | 11/2011 | Iwasa | H03H 7/0107 |
| | | | | 361/56 |
| 2016/0127157 | A1* | 5/2016 | Wojnowski | H04L 25/085 |
| | | | | 375/257 |
| 2016/0285483 | A1* | 9/2016 | Ke | H04B 1/40 |
| 2016/0352301 | A1* | 12/2016 | Teng | H01F 17/0033 |
| 2018/0041185 | A1* | 2/2018 | Omori | H03H 7/427 |

FOREIGN PATENT DOCUMENTS

| | | | | |
|---|---|---|---|---|
| JP | 2000340437 A | * | 12/2000 | |
| JP | 2004-273490 A | | 9/2004 | |
| JP | 2004165448 A | * | 10/2004 | H01F 17/04 |
| JP | 2005-318539 A | | 11/2005 | |
| JP | 2006-191551 A | | 7/2006 | |
| JP | 2008028214 A | * | 2/2008 | H01C 7/10 |
| JP | 2008028214 A | * | 2/2008 | |

OTHER PUBLICATIONS

MIPI Alliance; Physical Layer Specifications; D-PHY Specification v1.2; pp. 1-2; (http://mipi.org/specifications/physical-layer#D-PHY).

An Office Action; "Notice of Reasons for Rejection," issued by the Japanese Patent Office dated Jan. 16, 2018, which rresponds to Japanese Patent Application No. 2015-144968 and is related to U.S. Appl. No. 15/213,857.

* cited by examiner

WITHOUT COMMON-MODE CHOKE COIL

COMMON-MODE CHOKE COIL INSERTED

FIG. 5A
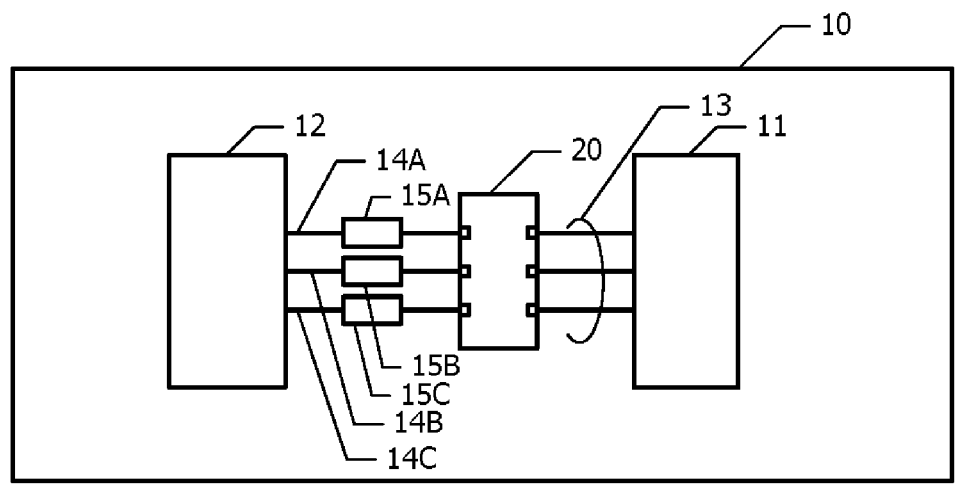
FIG. 5B
FIG. 5C
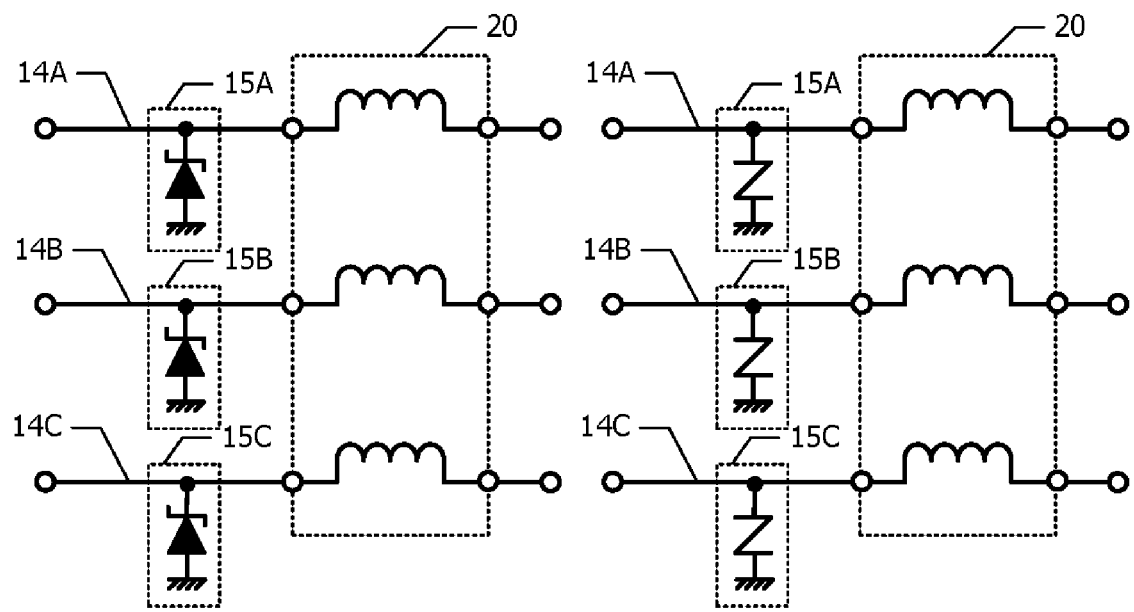

NOISE FILTER IMPLEMENTATION STRUCTURE

CROSS REFERENCE TO RELATED APPLICATIONS

This application claims benefit of priority to Japanese Patent Application 2015-144968 filed Jul. 22, 2015, the entire content of which is incorporated herein by reference.

TECHNICAL FIELD

The present disclosure relates to a noise filter implementation structure that removes common-mode noise.

BACKGROUND

As a signal interface between an integrated circuit device within a mobile apparatus and a display as well as a camera module, MIPI D-PHY specification is defined (MIPI D-PHY specification v1.2: http://mipi.org/specifications/physical-layer # D-PHY Specification). In the D-PHY specification, a differential transmission system is used in which signals respectively transmitted through two wires have a relationship where phases are opposite to each other. In a transmission line employing the differential transmission system, a common-mode choke coil is used as a noise filter that has almost no influence on transmitted signals and that removes common-mode noise. The common-mode choke coil includes two coils coupled to each other. The two coils are serially inserted into two respective wires.

SUMMARY

Recently, a transmission system with three wires (MIPI C-PHY specification) has been proposed. In the transmission system conforming to the MIPI C-PHY specification, an increase in a signal transmission speed is possible unlike in the case of the MIPI D-PHY specification. Protection against noise for a signal transmitted in a transmission system based on the MIPI C-PHY specification is required.

When only two wires among three wires are noted, electric signals conforming to the MIPI C-PHY specification transmitted in the two wires do not necessarily have opposite phases. Hence, when existing common-mode choke coils are inserted into pairs of two wires selected from the three wires, signal waveforms are deformed. As a result, it is difficult to transfer data normally.

Accordingly, it is an object of the present disclosure to provide a noise filter implementation structure that can effectively remove common-mode noise on a transmission line including three wires.

A noise filter implementation structure according to an aspect of the present disclosure includes: a transmission line including three wires formed on a substrate, each of the lines transmitting a three-level signal; and a common-mode choke coil inserted into the transmission line. The common-mode choke coil includes three coils coupled to one another and three pairs of outer electrodes, each of the three pairs being connected to a corresponding two ends of the coils; and the outer electrodes are connected to the transmission line such that the three coils are serially inserted into the three respective wires.

As a result of the three coils being coupled to one another, the deformation of the waveforms of signals transmitted through the three wires can be suppressed. Further, transmission of common-mode noise is suppressed.

In the noise filter implementation structure, a coupling coefficient between two coils selected from the three coils may be the same for any combination of two coils.

The deformation of the waveforms of signals transmitted through the three wires can be further suppressed.

The noise filter implementation structure may further include electrostatic discharge protection devices respectively connected to the three wires.

The electrostatic breakdown of the components connected to the transmission line can be avoided.

In the noise filter implementation structure, the common-mode choke coil may include a ground terminal connected to a ground conductor formed on the substrate and electrostatic discharge protection structures respectively inserted between first ends of the three coils and the ground.

The electrostatic breakdown of the components connected to the transmission line can be avoided. Further, the number of elements and the implementation area of the elements can be reduced.

As a result of the three coils being coupled to one another, the deformation of the waveforms of signals transmitted through the three wires can be suppressed. Further, transmission of common-mode noise is suppressed.

Other features, elements, characteristics and advantages of the present disclosure will become more apparent from the following detailed description of preferred embodiments of the present disclosure with reference to the attached drawings.

BRIEF DESCRIPTION OF THE DRAWINGS

FIG. 5A is a plan view of a noise filter implementation structure according to a second embodiment, FIG. 5B is an equivalent circuit diagram of the common-mode choke coil and the electrostatic discharge protection devices, and FIG. 5C is an equivalent circuit diagram of another configuration example of the common-mode choke coil and the electrostatic discharge protection devices.

DETAILED DESCRIPTION

Referring to FIG. 1A to FIG. 4B, a noise filter implementation structure according to a first embodiment will be described.

Figure 1A:
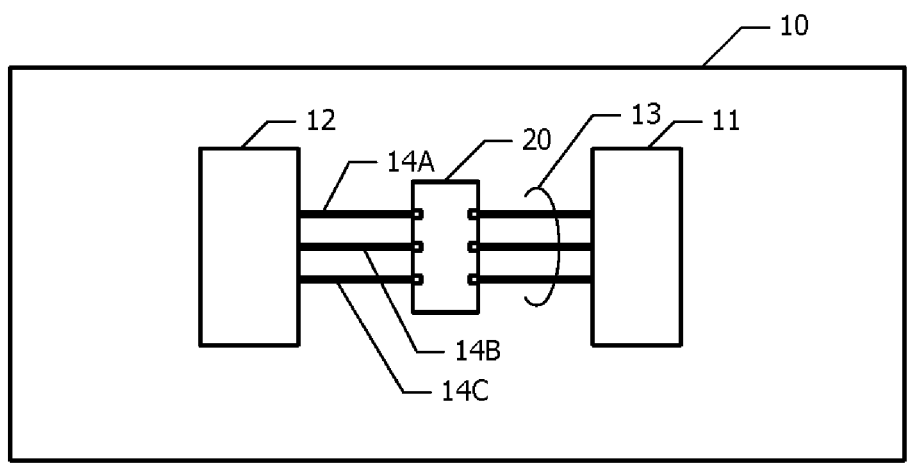
FIG. 1A is a plan view of a noise filter implementation structure according to a first embodiment.

FIG. 1A is a plan view of the noise filter implementation structure according to the first embodiment. A substrate 10 includes a first component 11 and a second component 12 mounted thereon. For example, a printed circuit substrate is used as the substrate 10. The first component 11 is, for example, an application processor and the second component 12 is, for example, a camera module, a display module, or the like.

The first component 11 and the second component 12 are connected to each other by a transmission line 13. The first component 11 and the second component 12 are connected to each other by the transmission line 13 through an interface conforming to, for example, the MIPI C-PHY specification. The transmission line 13 includes three wires 14A, 14B, and 14C. A three-level electric signal is transmitted over each of the three wires 14A, 14B, and 14C. The wires 14A, 14B, 14C are formed of, for example, three printed wiring lines having the same length arranged in parallel with one another. A common-mode choke coil 20 has been inserted into the transmission line 13.

Figure 1B:
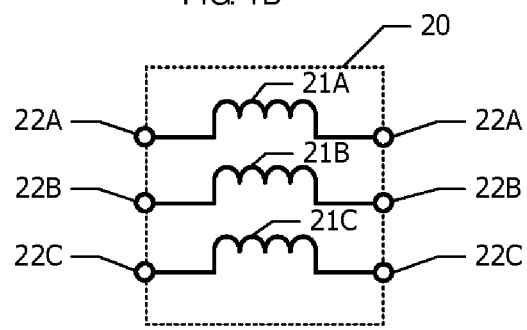
FIG. 1B is an equivalent circuit diagram of a common-mode choke coil.

FIG. 1B is an equivalent circuit diagram of the common-mode choke coil 20. The common-mode choke coil 20 includes three coils 21A, 21B, and 21C magnetically coupled to one another, and three pairs of outer electrodes 22A, 22B, and 22C. It is preferable to form the common-mode choke coil 20 such that a coupling coefficient between two coils selected from the three coils 21A, 21B, and 21C is the same for any combination of two coils. The respective two ends of the coils 21A, 21B, and 21C are connected to the corresponding three pairs of outer electrodes 22A, 22B, and 22C. The three pairs of outer electrodes 22A, 22B, and 22C are connected to the transmission line 13 such that the three coils 21A, 21B, and 21C are respectively inserted serially into the wires 14A, 14B, and 14C (FIG. 1A).

When currents flow in the same direction through the three wires 14A, 14B, and 14C, magnetic flux generated by the coil 21A, magnetic flux generated by the coil 21B, and magnetic flux generated by the coil 21C are enhanced by one another.

Figure 1C:
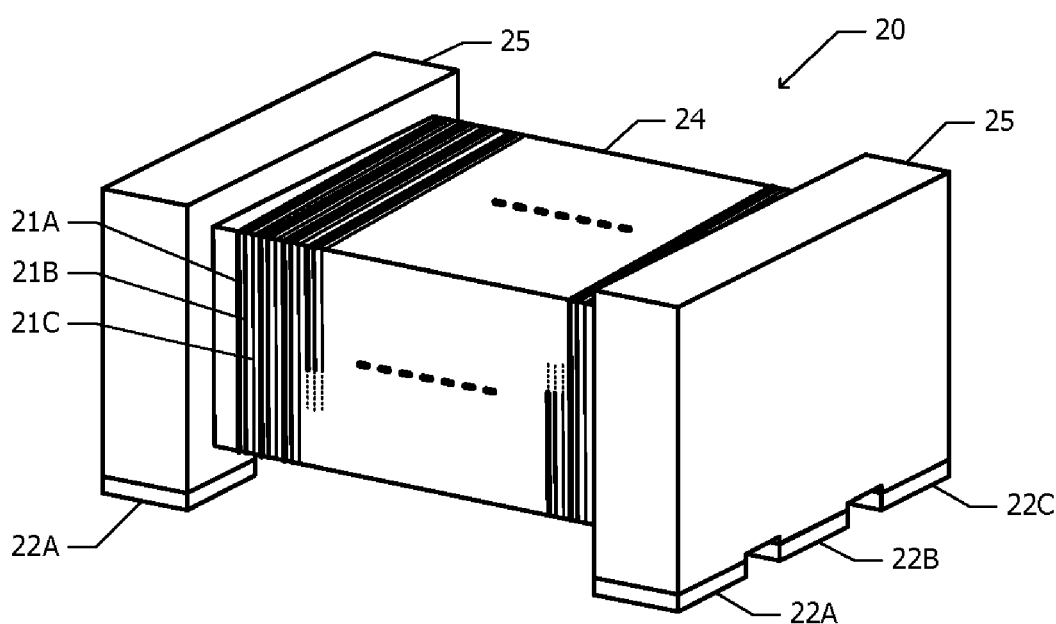
FIG. 1C is a perspective view of the common-mode choke coil.

FIG. 1C is an example of a perspective view of the common-mode choke coil 20. The coils 21A, 21B, and 21C are formed of three wires wound around a body portion (winding core portion) 24 of a ferrite core. The wire of the coil 21A, the wire of the coil 21B, and the wire of the coil 21C are wound so as to be aligned in this order, and the winding directions of the three coils 21A, 21B, and 21C are the same. Respective brim portions 25 are attached to the two ends of the body portion 24. The outer electrodes 22A, 22B, and 22C are formed at each of the brim portions 25.

Although a wound coil is illustrated as the common-mode choke coil 20 in FIG. 1C, a multilayer or thin film coil may be used as the common-mode choke coil 20.

In the MIPI C-PHY specification, each of electric signals transmitted through the three wires 14A, 14B, and 14C (FIG. 1A) of the transmission line 13 has one of three voltage levels, i.e., a high (H) level, a middle (M) level, and a low (L) level. Further, electric signals having the same voltage level do not exist at the plurality of wires at the same time. The amounts of change in the voltages of the three wires 14A, 14B, and 14C cancel one another out. In other words, the sum of the amounts of change in the voltages of the three wires 14A, 14B, and 14C is zero.

The amount of change in voltage of each of the three wires 14A, 14B, and 14C is approximately proportional to the amount of change in current. Hence, the sum of the amounts of changes in currents flowing through the three wires 14A, 14B, and 14C also becomes zero. Since the sum of the amounts of changes in currents is zero, changes in magnetic flux generated by the three coils 21A, 21B, and 21C included in the common-mode choke coil 20 cancel one another out. Hence, the common-mode choke coil 20 does not substantially act as impedance for the electric signals transmitted through the three wires 14A, 14B, and 14C. As a result, the common-mode choke coil 20 inserted into the transmission line 13 (FIG. 1A) does not influence the waveforms of electric signals transmitted through the three wires 14A, 14B, and 14C.

It was confirmed by simulation that the common-mode choke coil 20 does not influence the waveforms of electric signals transmitted through the three wires 14A, 14B, and 14C. Hereinafter, the simulation results will be described with reference to FIG. 2A and FIG. 2B.

Figure 2A:
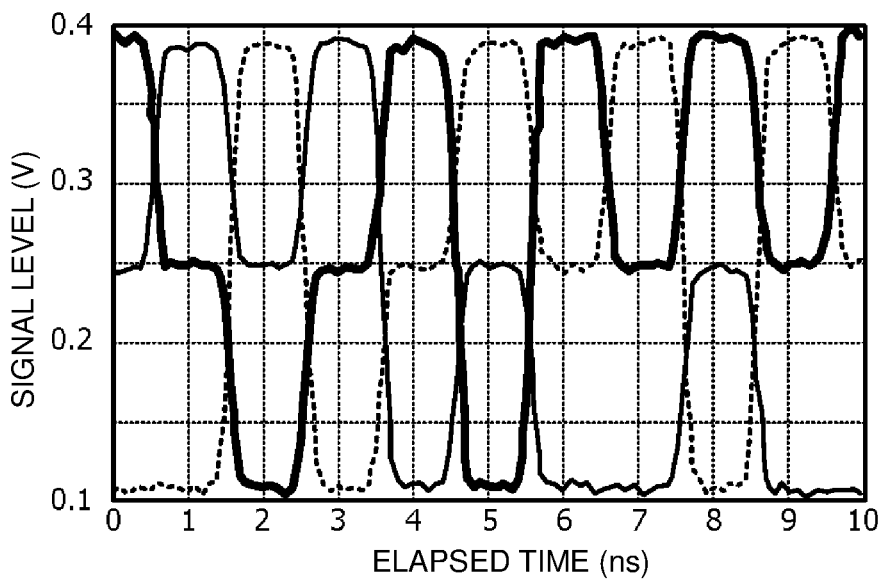
FIG. 2A is a graph illustrating the waveforms of electric signals transmitted through a transmission line into which the common-mode choke coil has not been inserted.
Figure 2B:
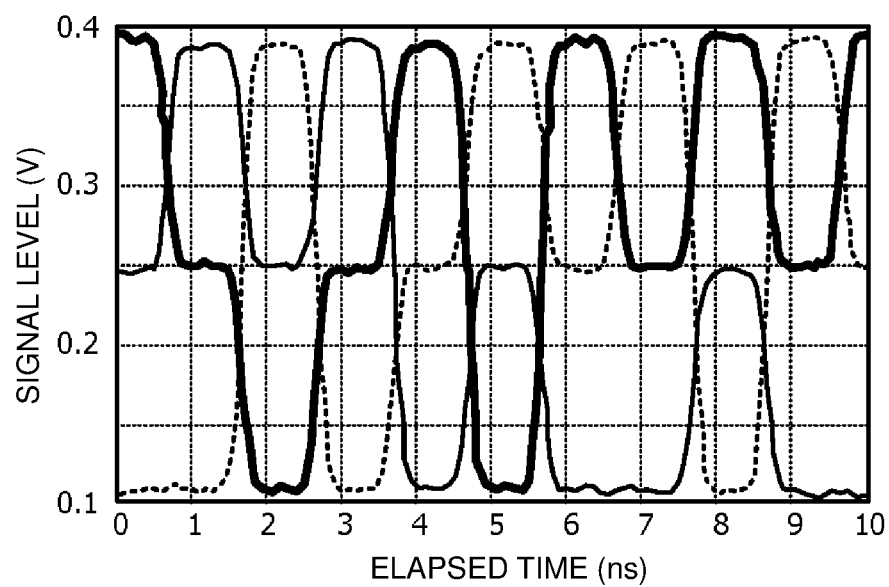
FIG. 2B is a graph illustrating the waveforms of electric signals transmitted through the transmission line into which the common-mode choke coil has been inserted.

FIG. 2A illustrates the waveforms of electric signals transmitted through the transmission line 13 (FIG. 1A) into which the common-mode choke coil 20 has not been inserted. FIG. 2B illustrates the waveforms of electric signals transmitted through the transmission line 13 (FIG. 1A) into which the common-mode choke coil 20 has been inserted. In each figure, the horizontal axis represents elapsed time in units of [ns], and the vertical axis represents signal level in units of [V]. The conditions for the simulation were as follows: the self impedance of the coils 21A, 21B, and 21C was 0.15 µH and the coupling coefficient between two of the coils was 0.99. Here, as the value of the "coupling coefficient", a value at the time when the two ends of a third coil other than the two coils under consideration are open was employed.

A bold solid line, a thin solid line, and a broken line in each of FIG. 2A and FIG. 2B respectively represent the waveforms of electric signals transmitted through the wires 14A, 14B, and 14C. The original waveforms of the electric signals illustrated in FIG. 2A and FIG. 2B are the same. The electric signals have one of the values among about 0.1 V, about 0.25 V, and about 0.4 V. The same signal level does not exist at the plurality of wires at the same time. The sum of the amounts of change in the signal levels of electric signals respectively transmitted through the three wires 14A, 14B, and 14C is zero.

When FIG. 2A and FIG. 2B are compared with each other, it can be seen that the waveforms of electric signals transmitted through the transmission line 13 (FIG. 1A) are negligibly disturbed even when the common-mode choke coil 20 (FIG. 1A) is inserted. In this way, when the sum of the amounts of change in the electric signals transmitted through the three wires 14A, 14B, and 14C is zero, the deformation of the waveforms of electric signals can be suppressed.

For comparison, simulation of a noise filter implementation structure was performed, the noise filter implementation structure employing a configuration in which a common-mode choke coil applied to an existing transmission line formed of two wires has been inserted into a transmission line formed of three wires.

Figure 3A:
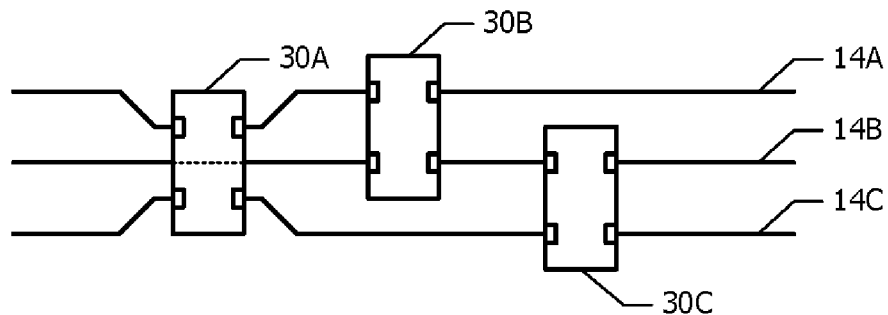
FIG. 3A is a diagram illustrating a configuration of connection between the transmission line and the common-mode choke coil to be simulated.

FIG. 3A illustrates a configuration of connection between the transmission line and a common-mode choke coil, to be simulated. Common-mode choke coils 30A, 30B, and 30C for two wires have been inserted into two corresponding wires selected from the three wires 14A, 14B, and 14C.

The common-mode choke coils 30A, 30B, and 30C for two wires do not influence the waveform of an electric signal when electric signals respectively transmitted through two wires have opposite phases. However, it cannot be said that electric signals transmitted through two wires selected from the three wires 14A, 14B, and 14C have opposite phases. Hence, common-mode choke coils 30A, 30B, and 30C act as inductance (impedance) for electric signals transmitted through the wires 14A, 14B, and 14C. The waveforms of electric signals transmitted through the wires 14A, 14B, and 14C are influenced by this impedance.

Figure 3B:
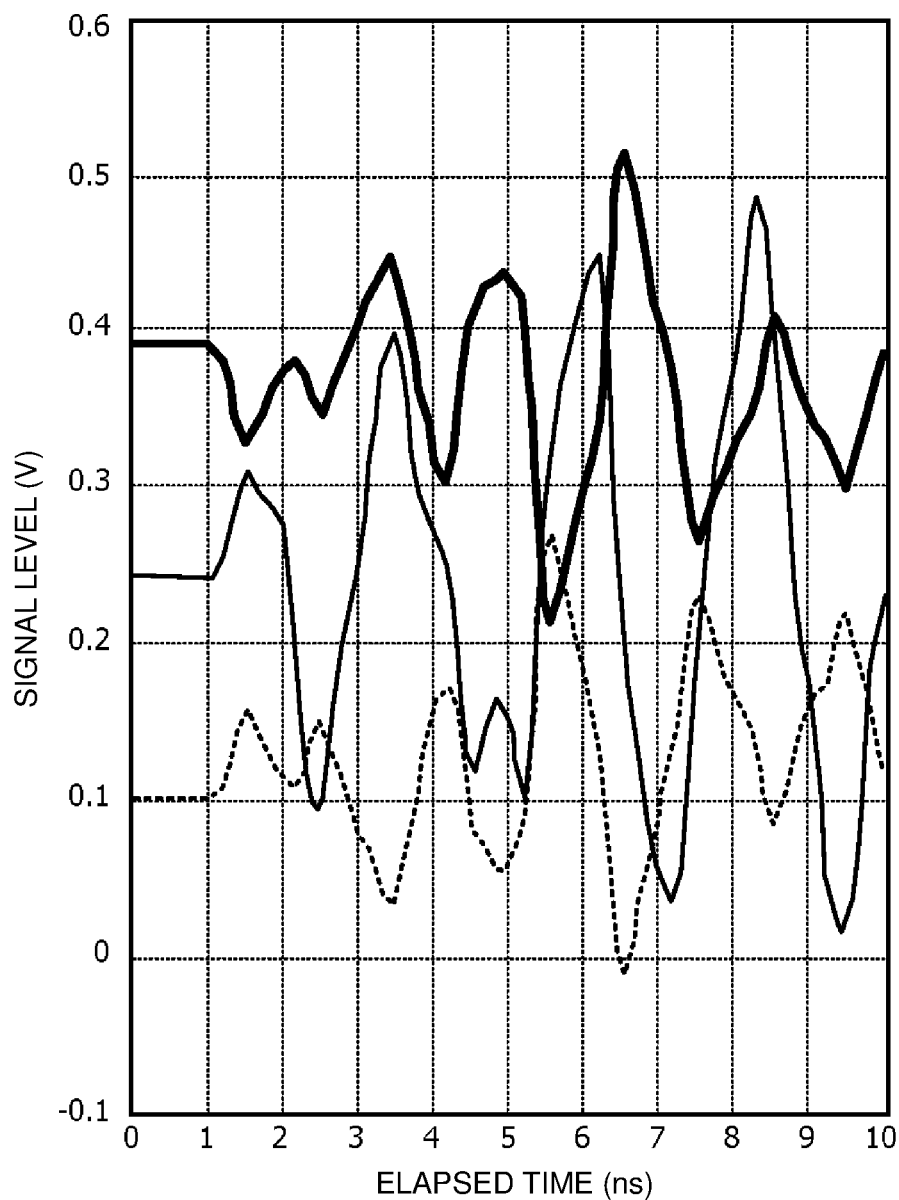
FIG. 3B is a graph illustrating the waveforms of electric signals transmitted through the transmission line illustrated in FIG. 3A.

FIG. 3B illustrates the waveforms of electric signals transmitted through the transmission line illustrated in FIG. 3A. The original waveforms are the same as the original waveforms of the electric signals illustrated in FIG. 2A and FIG. 2B. It can be seen that the waveforms are disturbed due to an influence from the common-mode choke coils 30A, 30B, and 30C.

By using the common-mode choke coil 20 including the three coils 21A, 21B, and 21C illustrated in FIG. 1A to FIG. 10, the deformation of the waveforms of electric signals conforming to the MIPI C-PHY specification transmitted through the three wires 14A, 14B, and 14C can be suppressed.

In the embodiment described above, in the case where electric signals having the same phase are transmitted through the three wires 14A, 14B, and 14C, changes in magnetic flux generated by the three coils 21A, 21B, and 21C are enhanced by one another. Hence, the common-mode choke coil 20 operates as an inductance (impedance) device for electric signals having the same phase. The common-mode choke coil 20 inserted into the transmission line 13 operates as an impedance device for the common-phase common-mode noise and, hence, has an effect of suppressing common-mode noise generated in the three wires 14A, 14B, and 14C.

In order to reduce an influence of the common-mode choke coil 20 on the waveforms of electric signals, it is preferable that the common-mode choke coil 20 be configured such that a coupling coefficient between two coils selected from the three coils 21A, 21B, and 21C is the same for any combination of two coils. Further it is preferable that coupling degrees among the three coils 21A, 21B, and 21C forming the common-mode choke coil 20 be increased. Specifically, it is preferable that a coupling coefficient between any two coils selected from the three coils 21A, 21B, and 21C be 0.9 or higher.

It was confirmed by simulation that the common-mode choke coil 20 suppresses common-mode noise generated in the three wires 14A, 14B, and 14C. Hereinafter, the simulation results will be described with reference to FIG. 4A and FIG. 4B. The common-mode choke coil 20 which is the target of the simulation has the same configuration as the common-mode choke coil 20 which was the target of the simulation in FIG. 2B.

Figure 4A:
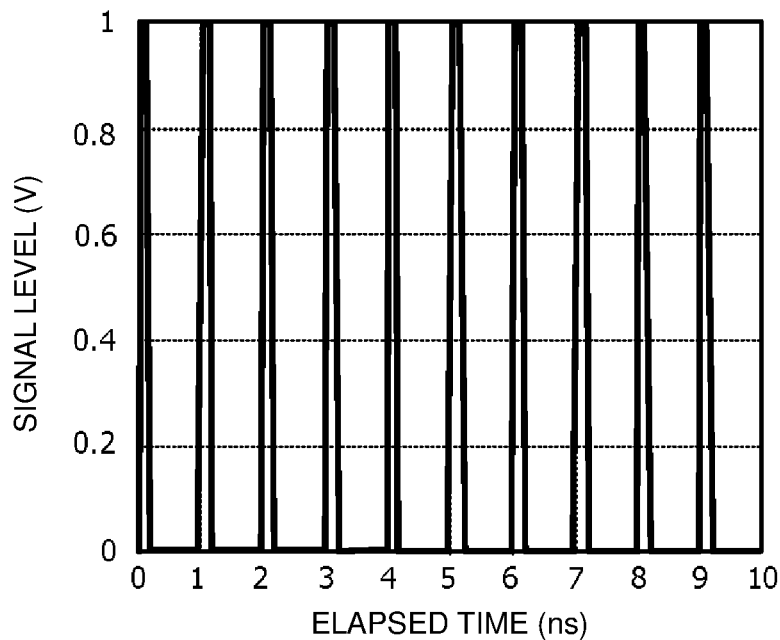
FIG. 4A is a graph illustrating the waveforms of electric signals having the same phase transmitted through a transmission line into which a common-mode choke coil has not been inserted.
Figure 4B:
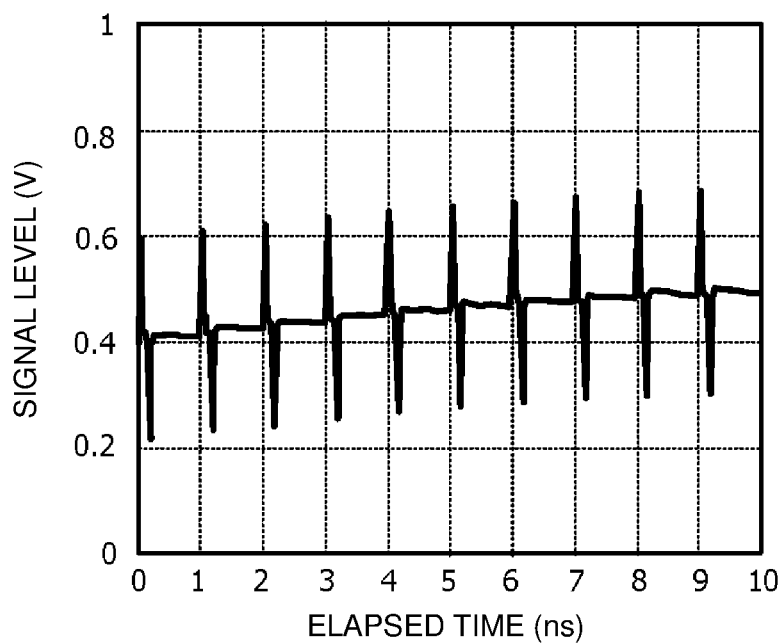
FIG. 4B is a graph illustrating the waveforms of electric signals having the same phase transmitted through the transmission line into which the common-mode choke coil has been inserted.

FIG. 4A illustrates the waveforms of electric signals having the same phase transmitted through the transmission line (FIG. 1A) into which the common-mode choke coil 20 has not been inserted. FIG. 4B illustrates the waveforms of electric signals having the same phase transmitted through the transmission line 13 (FIG. 1A) into which the common-mode choke coil 20 has been inserted. The horizontal axis represents elapsed time in units of ns, and the vertical axis represents signal level in units of V. Electric signals having the same phase and the same magnitude are respectively applied to the three wires 14A, 14B, and 14C. In FIG. 4A and FIG. 4B, three electric signals transmitted through the three wires 14A, 14B, and 14C are illustrated so as to be superposed with one another.

When comparing FIG. 4B with FIG. 4A, it can be seen that the amplitudes of the electric signals having the same phase are decreased by inserting the common-mode choke coil 20. As can be seen from these simulation results, the noise filter implementation structure illustrated in FIG. 1A has an effect of suppressing common-mode noise.

Next, referring to FIG. 5A to FIG. 5C, a noise filter implementation structure according to a second embodiment will be described. Hereinafter, the difference from the first embodiment described with reference to FIG. 1A to FIG. 4B will be described, and description of common configurations will be omitted.

FIG. 5A is a plan view of a noise filter implementation structure according to the second embodiment. The configurations of the substrate 10, the first component 11, the second component 12, the transmission line 13, and the common-mode choke coil 20 are the same as those in the first embodiment. In the second embodiment, electrostatic discharge protection devices 15A, 15B, and 15C are respectively connected to the three wires 14A, 14B, and 14C of the transmission line 13.

FIG. 5B is an equivalent circuit diagram of the common-mode choke coil 20 and the electrostatic discharge protection devices 15A, 15B, and 15C. In the example illustrated in FIG. 5B, Zener diodes are used as the electrostatic discharge protection devices 15A, 15B, and 15C. The cathodes of the three Zener diodes are respectively connected to the wires 14A, 14B, and 14C and the anodes are connected to the ground conductor of the substrate 10 (FIG. 5A).

As illustrated in FIG. 5C, varistors, devices based on a gap system, or the like may be used as the electrostatic discharge protection devices 15A, 15B, and 15C instead of Zener diodes.

By connecting the electrostatic discharge protection devices 15A, 15B, and 15C respectively to the three wires 14A, 14B, and 14C, the electrostatic breakdown of the first component 11 and the second component 12 can be avoided.

Next, referring to the diagrams of FIG. 6A to FIG. 6C, a noise filter implementation structure according to a third embodiment will be described. Hereinafter, the difference from the second embodiment described with reference to FIG. 5A to FIG. 5C will be described, and description of common configurations will be omitted.

Figure 6A:
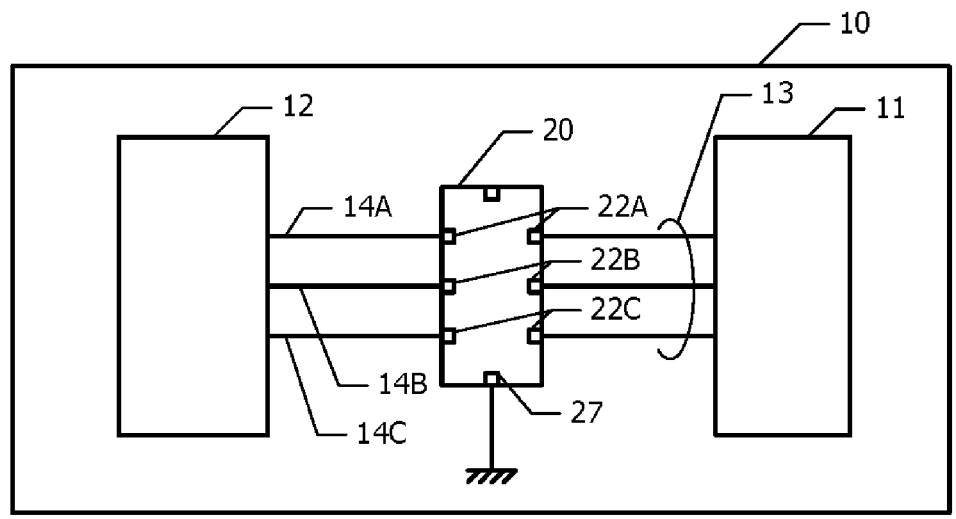
FIG. 6A is a plan view of a noise filter implementation structure according to a third embodiment.

FIG. 6A is a plan view of a noise filter implementation structure according to the third embodiment. The configurations of the substrate 10, the first component 11, the second component 12, and the transmission line 13 are the same as those in the second embodiment. In the second embodiment, discrete devices are used as the electrostatic discharge protection devices 15A, 15B, and 15C (FIG. 5A). On the other hand, the common-mode choke coil 20 includes the electrostatic discharge protection structure, in the third embodiment.

The common-mode choke coil 20 includes a ground terminal 27 other than the three pairs of outer electrodes 22A, 22B, and 22C respectively connected to the three coils 21A, 21B, and 21C (FIG. 1B). The ground terminal 27 is connected to the ground conductor of the substrate 10.

Figure 6B:
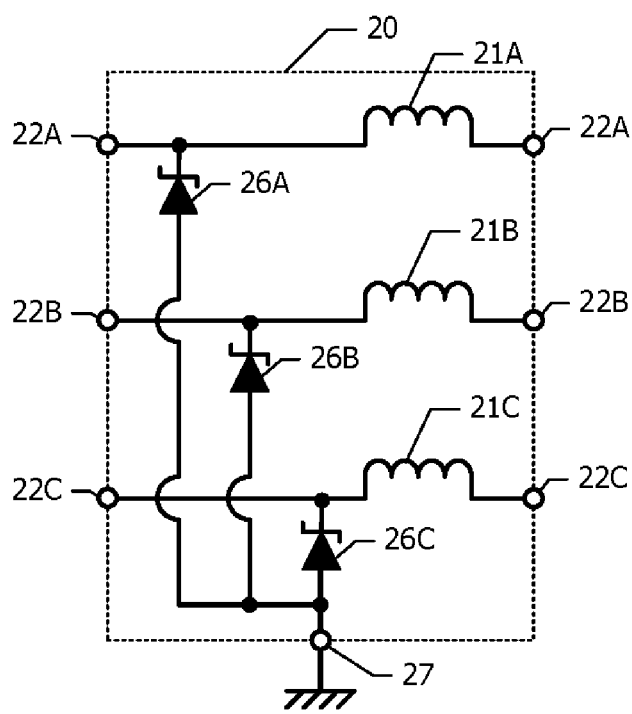
FIG. 6B is an equivalent circuit diagram of the common-mode choke coil and the electrostatic discharge protection devices.

FIG. 6B is an equivalent circuit diagram of the common-mode choke coil 20 used in the third embodiment. The common-mode choke coil 20 includes the three coils 21A, 21B, and 21C and three electrostatic discharge protection structures 26A, 26B, and 26C.

The two ends of the coil 21A are respectively connected to the pair of outer electrodes 22A, the two ends of the coil 21B are respectively connected to the pair of outer electrodes 22B, and the two ends of the coil 21C are respectively connected the pair of outer electrodes 22C. The electrostatic discharge protection structures 26A, 26B, and 26C are connected between respective first ends of the coils 21A, 21B, and 21C and the ground terminal 27. In the example illustrated in FIG. 6B, the electrostatic discharge protection structures 26A, 26B, and 26C are formed of Zener diodes. The anodes of the three Zener diodes are connected to the ground terminal 27, and the cathodes of the three Zener diodes are respectively connected to the first ends of the coils 21A, 21B, and 21C.

Figure 6C:
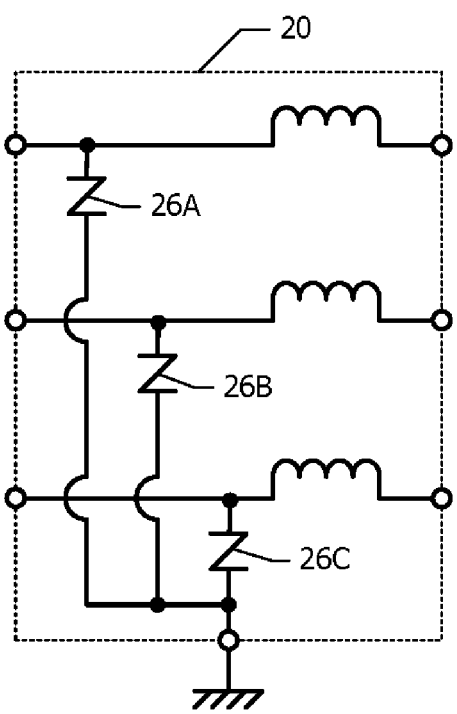
FIG. 6C is an equivalent circuit diagram of another configuration example of the common-mode choke coil and the electrostatic discharge protection devices.

The electrostatic discharge protection structures 26A, 26B, and 26C may be formed of varistors as illustrated in FIG. 6C. Further, each of the electrostatic discharge protection structures 26A, 26B, and 26C can be formed of two conductor patterns facing each other with a small gap therebetween.

Also in the third embodiment, similarly to the second embodiment, electrostatic breakdown of the first component 11 and the second component 12 can be avoided. Further, since the electrostatic discharge protection structures 26A, 26B, and 26C are housed in the common-mode choke coil 20, the number of elements and the implementation area can be reduced.

The embodiments described above are examples, and it goes without saying that partial replacement or combination of the configurations illustrated in the different embodiments is possible. Similar operational effects obtained by similar configurations in a plurality of embodiments are not referred to for each embodiment. Further, the present disclosure is not limited to the embodiments described above. For example, it will be self-evident to those skilled in the art that various modifications, improvements, and combinations are possible.

While preferred embodiments of the disclosure have been described above, it is to be understood that variations and modifications will be apparent to those skilled in the art without departing from the scope and spirit of the disclosure. The scope of the disclosure, therefore, is to be determined solely by the following claims.

What is claimed is:

1. An apparatus comprising:
   an application processor;
   a module; and
   a noise filter implementation structure comprising:
   a ground conductor formed on a substrate;
   a transmission line including three wires formed on the substrate, each of the three wires transmitting a three-level signal which is different from a ground level; and
   a common-mode choke coil inserted into the transmission line,
   wherein the common-mode choke coil includes three coils coupled to one another and three pairs of outer electrodes, each of the three pairs being connected to corresponding two ends of the coils, and a coupling coefficient between any two coils selected from the three coils is 0.9 or higher,
   wherein the outer electrodes are connected to the transmission line such that the three coils are serially inserted into the respective three wires, and
   wherein the noise filter implementation structure is configured to transmit the three-level signal between the application processor and the module.

2. The noise filter implementation structure according to claim 1, wherein the coupling coefficient between the two coils selected from the three coils is the same for any combination of the two coils.

3. The noise filter implementation structure according to claim 1, further comprising electrostatic discharge protection devices respectively connected to the three wires.

4. The noise filter implementation structure according to claim 1,
   wherein the common-mode choke coil includes:
   a ground terminal connected to a ground conductor formed on the substrate, and
   electrostatic discharge protection structures respectively inserted between first ends of the three coils and the ground.

5. The noise filter implementation structure according to claim 1, wherein
   the three wires transmit the three-level signal of a high level, a middle level, and a low level, respectively.

* * * * *